United States Patent
Kim et al.

(10) Patent No.: US 9,368,645 B2
(45) Date of Patent: Jun. 14, 2016

(54) NONVOLATILE MEMORY DEVICE AND METHOD OF FABRICATING THE SAME

(71) Applicant: SK hynix Inc., Gyeonggi-do (KR)

(72) Inventors: Min-Soo Kim, Gyeonggi-do (KR);
Young-Jin Lee, Gyeonggi-do (KR);
Jin-Hae Choi, Gyeonggi-do (KR);
Joo-Hee Han, Gyeonggi-do (KR);
Sung-Jin Whang, Gyeonggi-do (KR);
Byung-Ho Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/711,526

(22) Filed: May 13, 2015

(65) Prior Publication Data
US 2015/0249095 A1 Sep. 3, 2015

Related U.S. Application Data

(62) Division of application No. 13/718,258, filed on Dec. 18, 2012, now Pat. No. 9,130,052.

(30) Foreign Application Priority Data

Aug. 21, 2012 (KR) ........................ 10-2012-0091111

(51) Int. Cl.
| | |
|---|---|
| *H01L 27/115* | (2006.01) |
| *H01L 21/768* | (2006.01) |
| *H01L 29/792* | (2006.01) |
| *H01L 29/66* | (2006.01) |

(52) U.S. Cl.
CPC ........ *H01L 29/792* (2013.01); *H01L 21/76889* (2013.01); *H01L 27/11568* (2013.01); *H01L 27/11573* (2013.01); *H01L 27/11582* (2013.01); *H01L 29/66833* (2013.01); *H01L 29/7926* (2013.01)

(58) Field of Classification Search
CPC ........................... H01L 27/115; H01L 21/768
USPC .......... 257/324, 532, 536, E21.409, E29.309; 438/289, 268, 201, 212, 257
See application file for complete search history.

(56) References Cited

U.S. PATENT DOCUMENTS

| | | | |
|---|---|---|---|
| 6,232,224 B1 * | 5/2001 | Inoue | ............................. 438/639 |
| 2011/0057250 A1 * | 3/2011 | Higashi | ......................... 257/324 |
| 2011/0062510 A1 * | 3/2011 | Joo | ................................ 257/324 |

* cited by examiner

*Primary Examiner* — Sheng Zhu
(74) *Attorney, Agent, or Firm* — IP & T Group LLP

(57) ABSTRACT

This technology relates to a nonvolatile memory device and a method of fabricating the same. The nonvolatile memory device may include a pipe connection gate electrode over a substrate, one or more pipe channel layers formed within the pipe connection gate electrode, pairs of main channel layers each coupled with the pipe channel layer and extended in a direction substantially perpendicular to the substrate, a plurality of interlayer insulating layers and a plurality of cell gate electrodes alternately stacked along the main channel layers, and etch stop layers including metal silicide and formed over the pipe connection gate electrode.

13 Claims, 15 Drawing Sheets

NONVOLATILE MEMORY DEVICE AND METHOD OF FABRICATING THE SAME

CROSS-REFERENCE TO RELATED APPLICATIONS

This application is a division of U.S. patent application Ser. No. 13/718,258 filed on Dec. 18, 2012, which claims priority of Korean Patent Application No. 10-2012-0091111, filed on Aug. 21, 2012. The disclosure of each of the foregoing application is incorporated herein by reference in its entirety.

BACKGROUND

1. Field

Exemplary embodiments of the present invention relate to a nonvolatile memory device and a method of fabricating the same, and more particularly, to a three-dimensional (3-D) structured nonvolatile memory device in which a plurality of memory cells are stacked in a vertical direction over a substrate and a method of fabricating the same.

2. Description of the Related Art

A nonvolatile memory device retains stored data although the power is not supplied. A variety of nonvolatile memory devices, such as flash memory, are being widely used.

As the improvement of the degree of integration of two-dimensional (2-D) structured nonvolatile memory devices with memory cells that are formed over a semiconductor substrate in the form of a single layer has reached the limit, there has been proposed a 3-D structured nonvolatile memory device in which a plurality of memory cells is formed along channel layers in a vertical direction over a semiconductor substrate. More particularly, the 3-D structured nonvolatile memory device is mainly divided into a structure having a straight-line type channel layer and a structure having a U-shaped channel layer.

In the structure having a U-shaped channel layer, a pipe connection transistor is used to couple memory cell strings. However, there is a concern in that electric resistance may increase, because the gate electrode of the pipe connection transistor (hereinafter referred to as a pipe connection gate electrode) is mainly made of polysilicon. Furthermore, a process margin may not be sufficient, because the pipe connection gate electrode may be damaged in a subsequent etch process for forming slits over the pipe connection gate electrode.

SUMMARY

Exemplary embodiments of the present invention are directed to a nonvolatile memory device for preventing etch damage to a pipe connection gate electrode and greatly reducing electric resistance by forming etch stop layers made of metal silicide over the pipe connection gate electrode and a method of fabricating the same.

In accordance with an embodiment of the present invention, a nonvolatile memory device may include a pipe connection gate electrode over a substrate, one or more pipe channel layers formed within the pipe connection gate electrode, pairs of main channel layers each coupled with the pipe channel layer and extended in a direction substantially perpendicular to the substrate, a plurality of interlayer insulating layers and a plurality of cell gate electrodes alternately stacked along the main channel layers, and etch stop layers including metal silicide and formed over the pipe connection gate electrode.

In accordance with another embodiment of the present invention, a method of fabricating a nonvolatile memory device may include forming a conductive layer for a gate electrode comprising at least one or more sacrificial layer patterns over a substrate, forming a pipe connection gate electrode by selectively etching the conductive layer, and forming etch stop layers including metal silicide over the pipe connection gate electrode other than some regions over the sacrificial layer patterns.

DETAILED DESCRIPTION

Figure 1A:
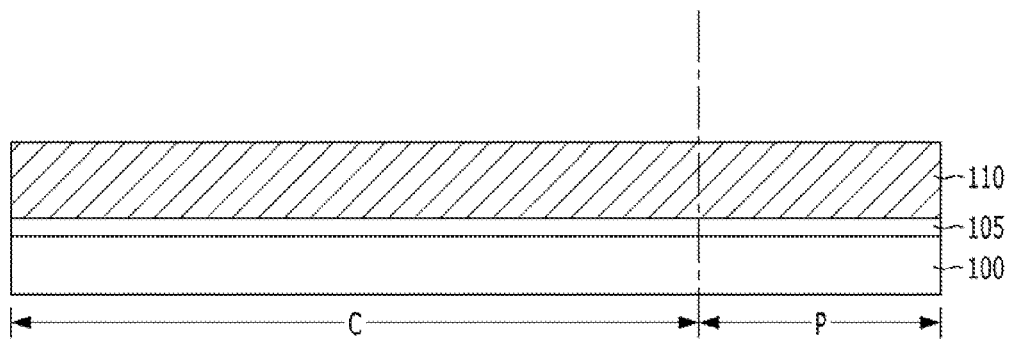
FIGS. 1A to 1R are cross-sectional views illustrating a nonvolatile memory device and a method of fabricating the same in accordance with a first embodiment of the present invention.
Figure 1B:
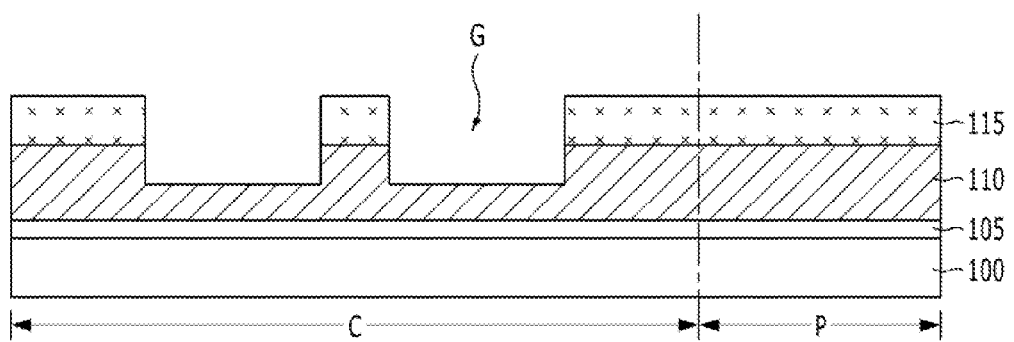

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" not only means "directly on" something but also include the meaning of "on" something with an intermediate feature or a layer therebetween, and that "over" not only means the meaning of "over" something may also include the meaning it is "over" something with no intermediate feature or layer therebetween (i.e., directly on something).

Figure 1C:
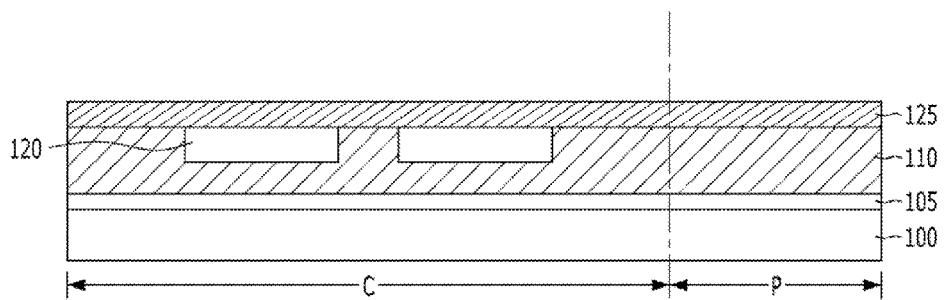
Figure 1D:
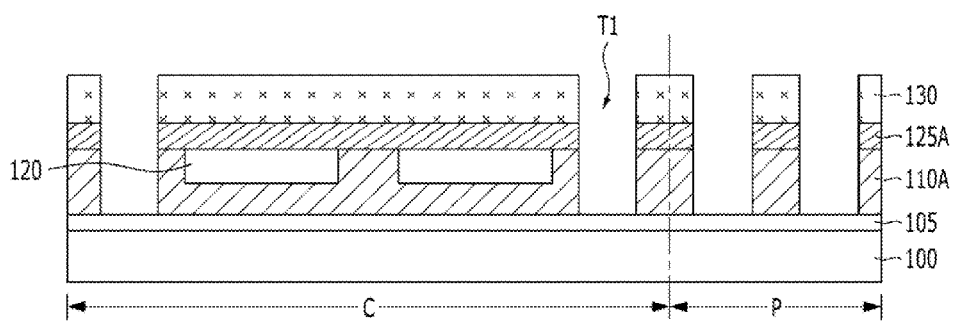
Figure 1E:
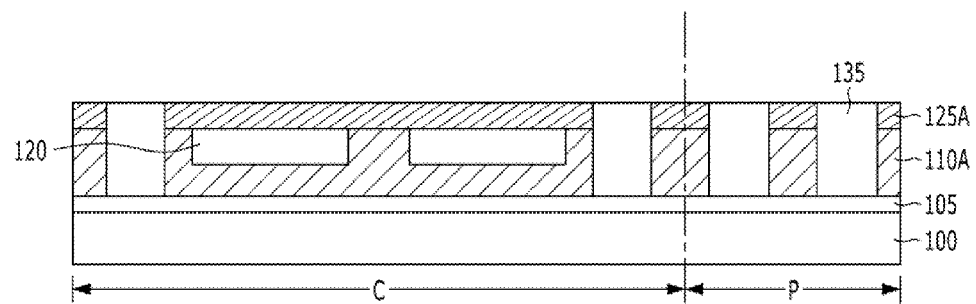
Figure 1F:
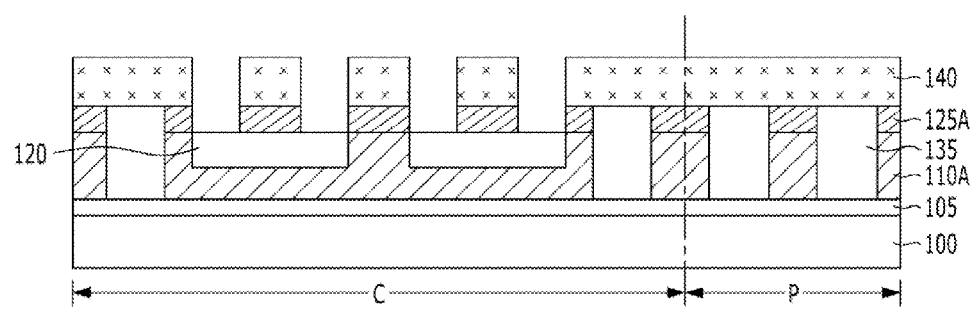
Figure 1G:
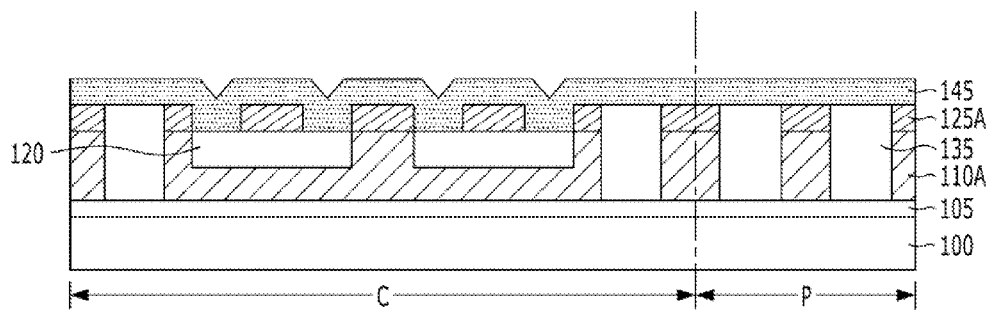
Figure 1H:
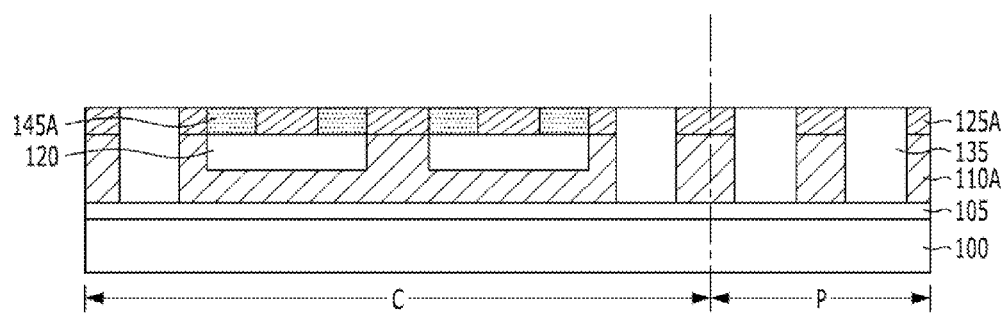
Figure 1I:
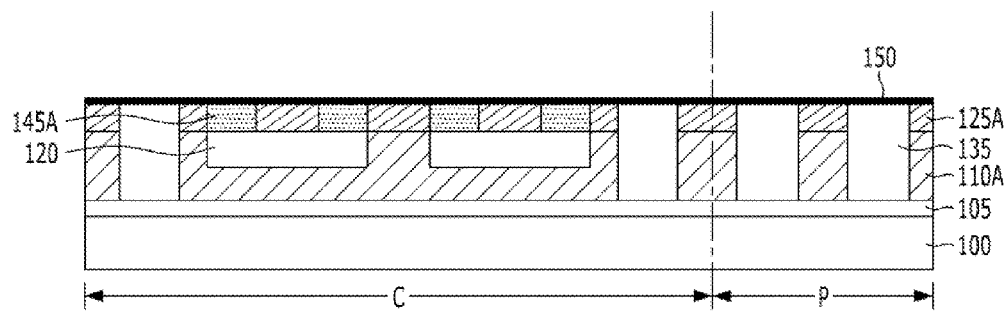
Figure 1J:
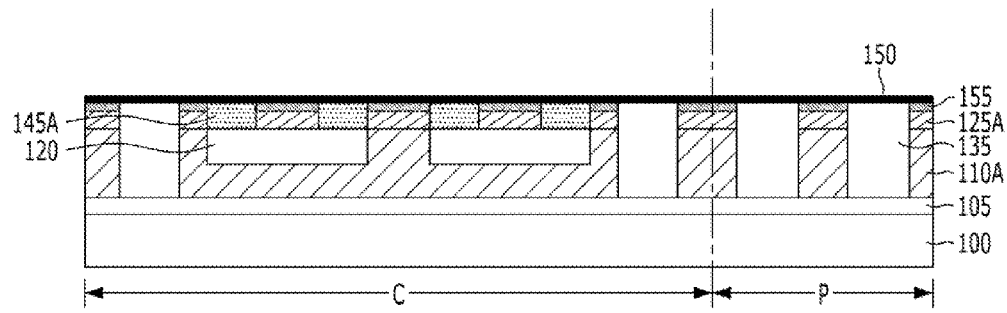
Figure 1K:
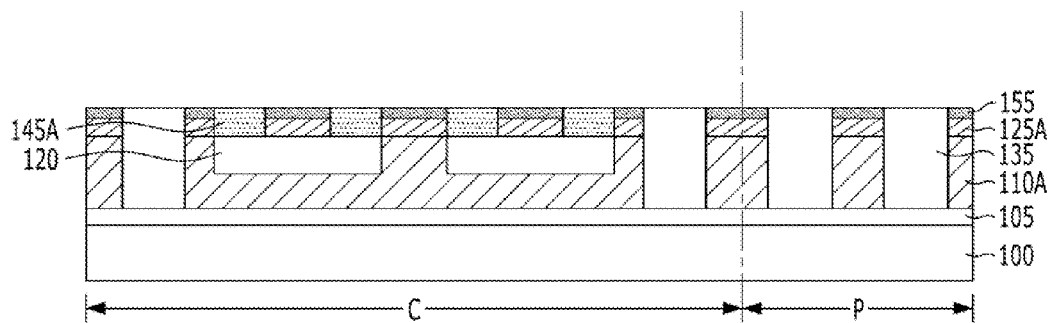
Figure 1L:
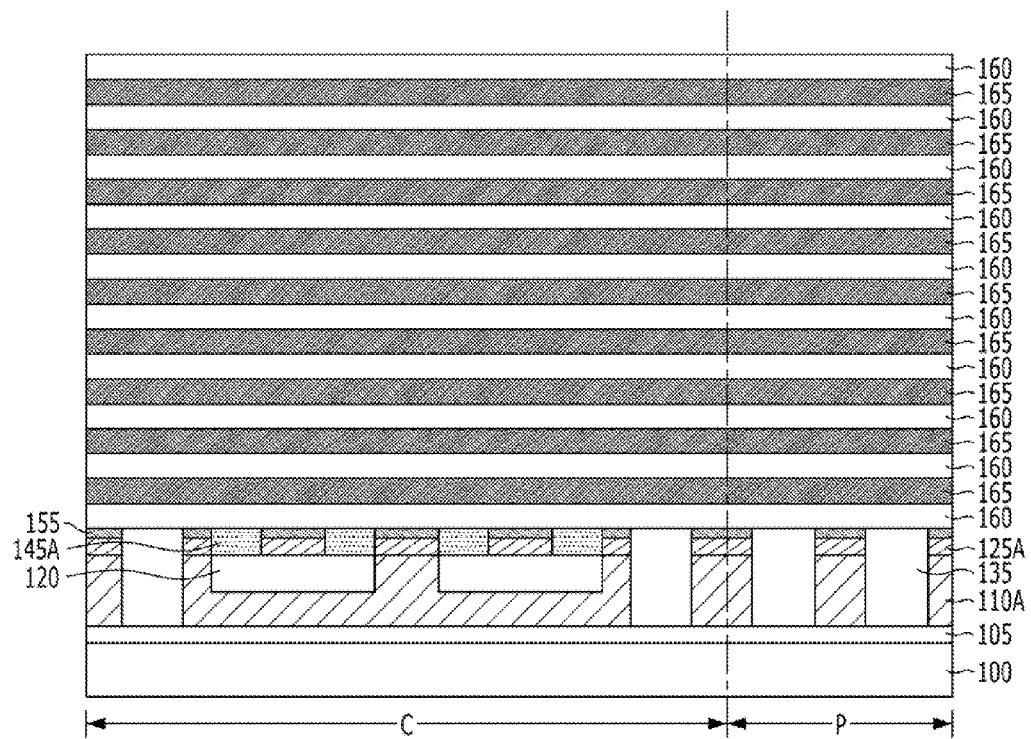
Figure 1M:
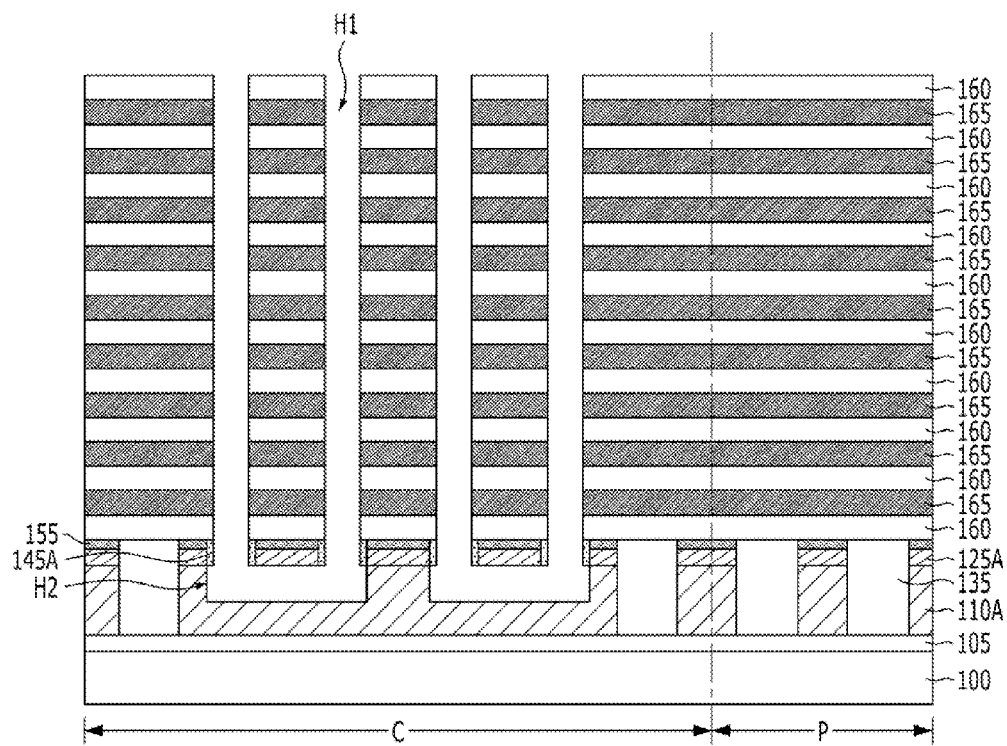
Figure 1N:
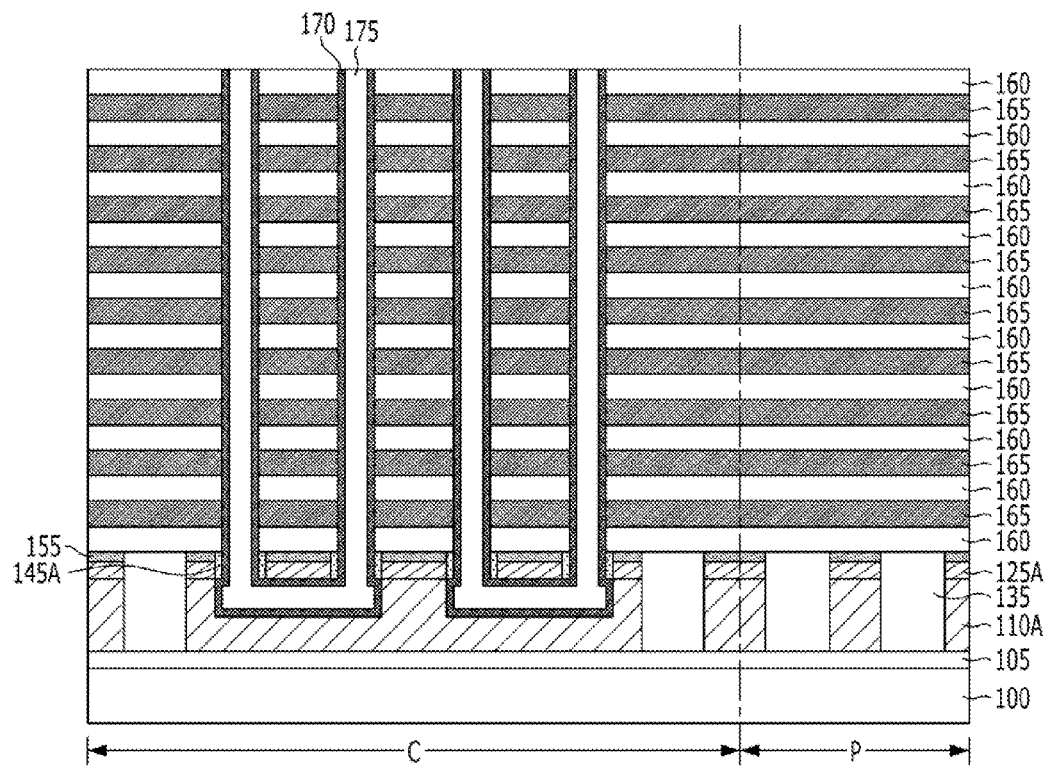
Figure 10:
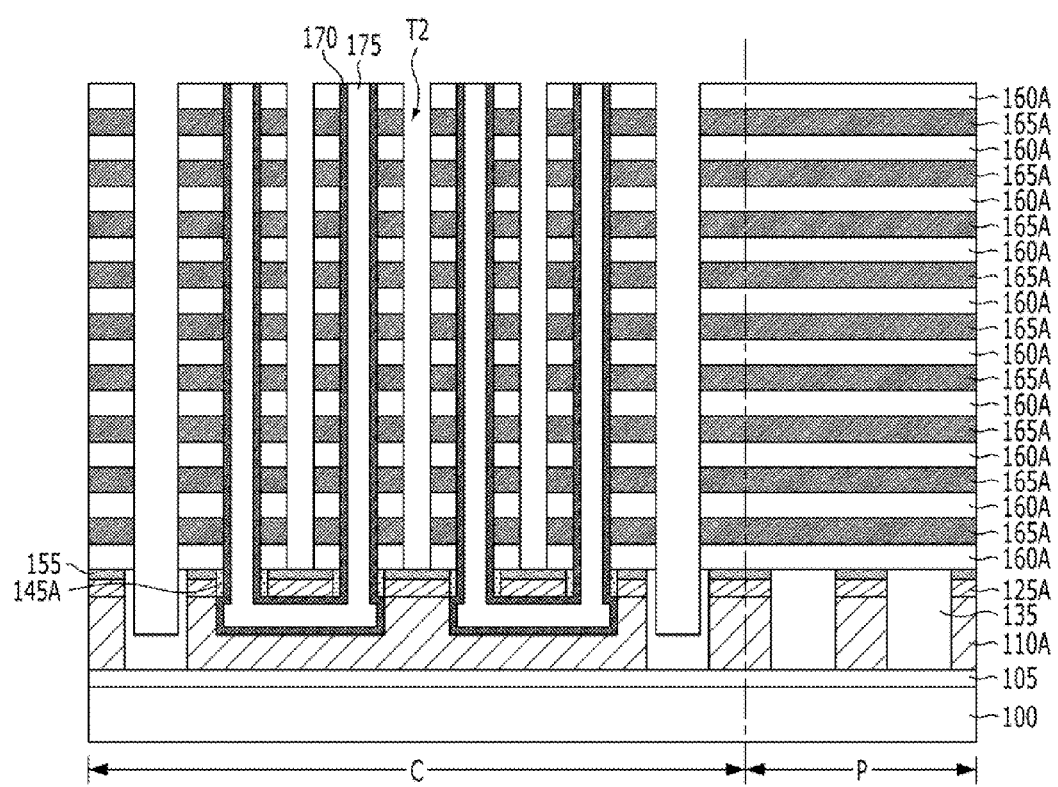
Figure 1P:
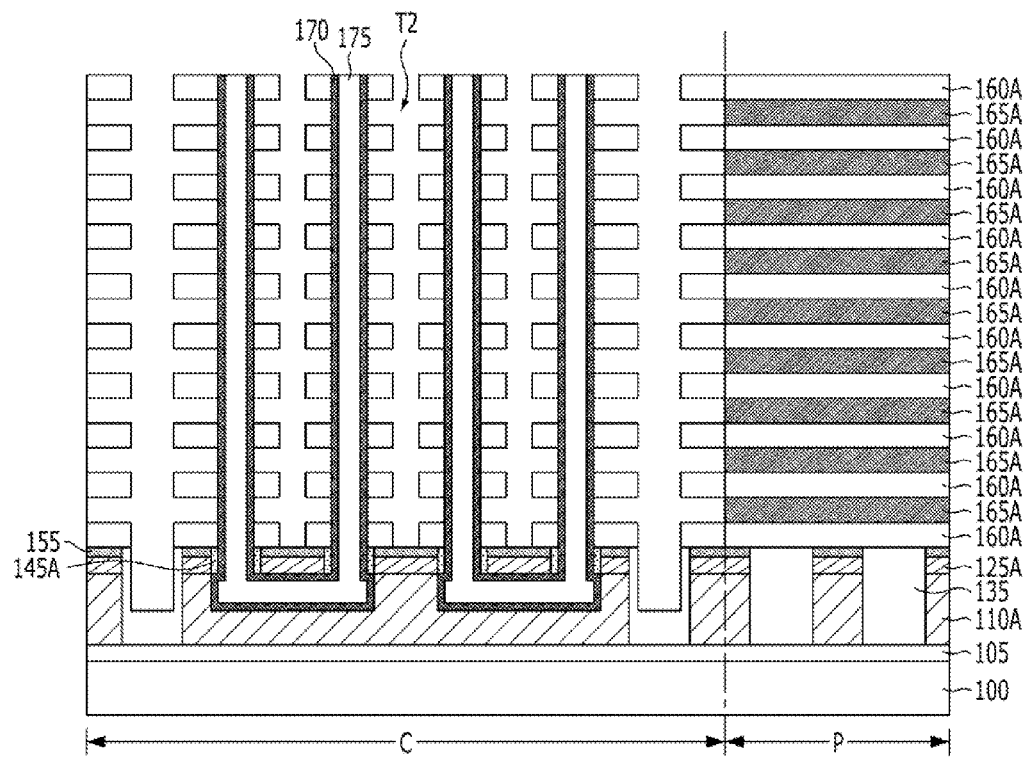
Figure 1Q:
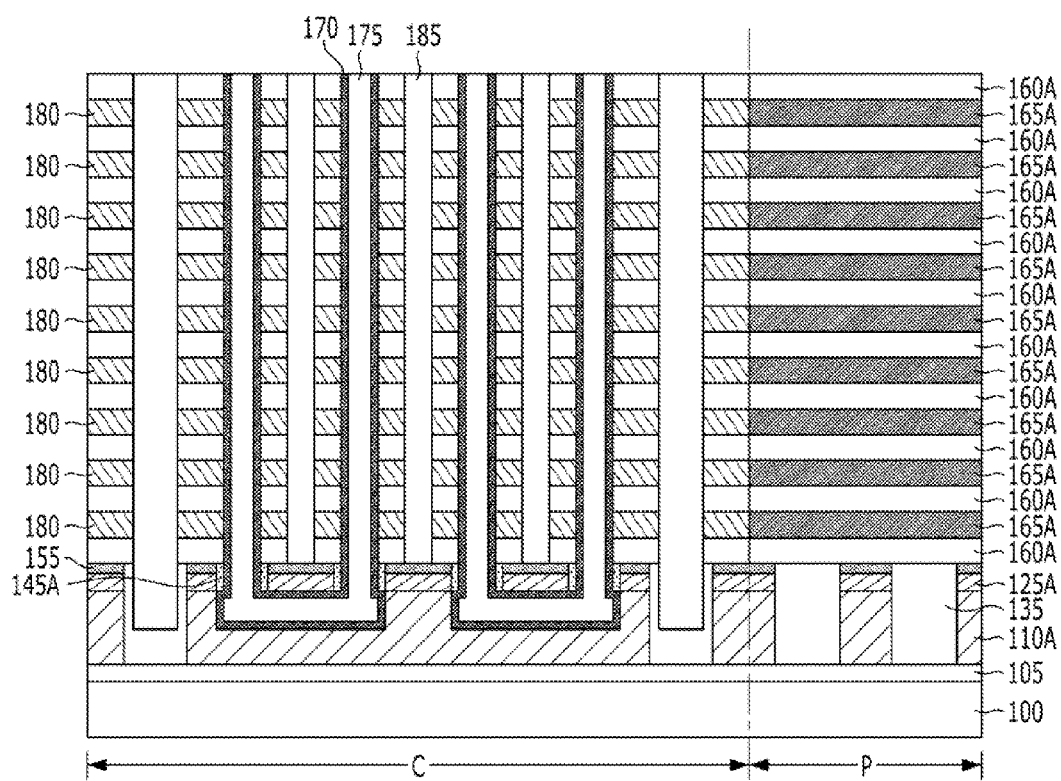
Figure 1R:
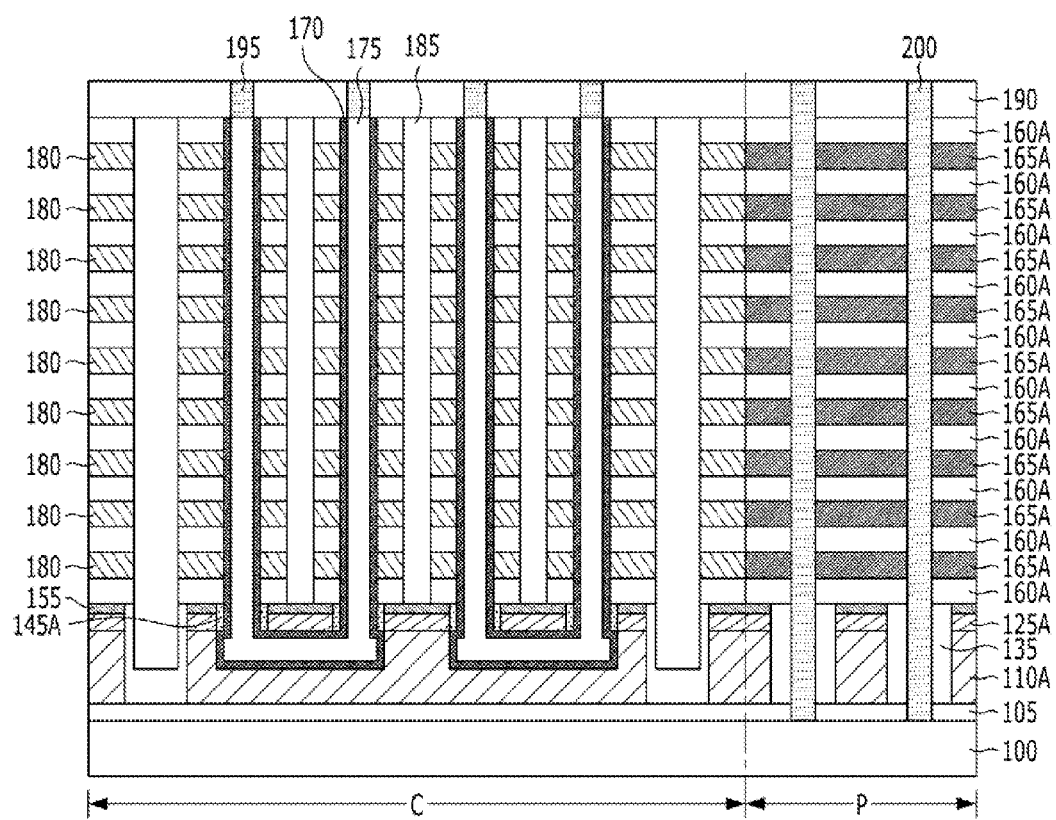

FIGS. 1A to 1R are cross-sectional views illustrating nonvolatile memory device and a method of fabricating the same in accordance with a first embodiment of the present invention. In particular, FIG. 1R is a cross-sectional view illustrating the nonvolatile memory device in accordance with the first embodiment of the present invention, and FIGS. 1A to 1Q are cross-sectional views illustrating an example of intermediate process steps for fabricating the nonvolatile memory device of FIG. 1R.

Referring to FIG. 1A, an isolation insulating layer 105 is formed on a substrate 100 including a cell region C and a peripheral region P. A first conductive layer 110 for gate electrodes is formed on the isolation insulating layer 105. The substrate 100 may be a semiconductor substrate, such as single crystalline silicon, and the substrate 100 may include specific underlying structures (not shown).

The isolation insulating layer 105 may include an oxide-based or nitride-based material. The first conductive layer 110 may be formed by depositing a conductive material, such as doped polysilicon, using an atomic layer deposition (ALD) or chemical vapor deposition (CVD) method.

Referring to FIG. 1S, a first hard mask pattern 115 where sacrificial layer patterns to be described later are exposed is formed on the first conductive layer 110 for gate electrodes. Grooves G are formed by etching the first conductive layer 110 for gate electrodes in the cell region C using the first hard mask pattern 115 as an etch mask. The first hard mask pattern 115 may include one or more selected from the group that includes an oxide-based or nitride-based material, polysilicon, an amorphous carbon layer (ACL), and a bottom antireflective coating (BARC) layer.

Referring to FIG. 1C, after removing the first hard mask pattern 115, sacrificial layer patterns 120 buried in the respective grooves G are formed. The sacrificial layer patterns 120 are removed in a subsequent process, thus functioning to provide spaces where pipe channel holes will be formed. The sacrificial layer patterns 120 may include a material having an etch rate different from an etch rate of a second conductive layer for gate electrodes, first material layers, second material layers, which will be described later, and the first conductive layer 110 for gate electrodes. Furthermore, the sacrificial layer pattern 120 may have an island form that has a long axis in the direction of the cross section of FIG. 1C and a short axis in a direction crossing the cross section of FIG. 1C. A plurality of the sacrificial layer patterns 120 may be arranged in a matrix form when viewed from a plane parallel to the substrate 100.

A second conductive layer 125 for gate electrodes is formed on the first conductive layer 110 and the sacrificial layer patterns 120. The second conductive layer 125 for gate electrodes may include a semiconductor material, such as silicon (Si), which reacts to metal. The second conductive layer 125 may be formed by depositing a conductive material, such as doped polysilicon, using an ALD or CVD method.

Referring to FIG. 1D, a second hard ask pattern 130 covering regions where a pipe connection gate electrode and peripheral gate electrodes to be described later will be formed is formed on the second conductive layer 125 for gate electrodes. Trenches T1 through which the isolation insulating layer 105 is exposed are formed by etching the second conductive layer 125 and the first conductive layer 110 using the second hard mask pattern 130 as an etch mask.

The second hard mask pattern 130 may include one or more selected from the group that has an oxide-based or nitride-based material, polysilicon, an ACL, and a BARC layer. Meanwhile, the first conductive layers 110 for gate electrodes and the second conductive layers 125 for gate electrodes separated by the trenches T1 are hereinafter referred to as first conductive layer patterns 110A for gate electrodes and second conductive layer patterns 125A for gate electrodes, respectively.

As a result of this process, the pipe connection gate electrode of the cell region C and the peripheral gate electrodes of the peripheral region P are formed. The pipe connection gate electrode and the peripheral gate electrodes have a form in which the first conductive layer patterns 110A and the second conductive layer patterns 125A are sequentially stacked. In particular, the pipe connection gate electrode may be separated on a block basis.

Referring to FIG. 1E, after removing the second hard mask pattern 130, first burial insulating layers 135 are formed within the trenches T1. The first burial insulating layers 135 may be formed by depositing an oxide-based or nitride-based material to a thickness that fills the trenches T1 and then performing a polishing process, such as chemical mechanical polishing (CMP), until a top surface of the second conductive layer patterns 125A for gate electrodes is exposed.

Referring to FIG. 1F, a third hard mask pattern 140 where in main channel holes to be described later will be formed are exposed is formed on the second conductive layer patterns 125A for gate electrodes and the first burial insulating layers 135. The sacrificial layer patterns 120 are partially exposed by etching the second conductive layer patterns 125A for gate electrodes using the third hard mask pattern 140 as an etch mask. The third hard mask pattern 140 may include one or more selected from the group that includes an oxide-based or nitride-based material, polysilicon, an ACL, and a BARC layer.

Referring to FIG. 1G, a mask layer 145 is formed on the entire surface of the substrate 100 in which the sacrificial layer patterns 120 are partially exposed. The mask layer 145 includes an insulating material that does not form a compound by a reaction with metal, and the mask layer 145 may be formed by depositing an oxide-based or nitride-based material conformably.

Referring to FIG. 1H, a polishing process, such as chemical mechanical polishing (CMP), is performed until a top surface of the second conductive layer patterns 125A is exposed. As a result of this process, the mask layer 145 remaining between the second conductive layer patterns 125A is referred to as a mask layer pattern 145A. In a subsequent process, etch stop layers, which will be described later, are not formed on the mask layer patterns 145A.

Referring to FIG. 1I, a metal layer 150 is formed on the entire surface of the substrate 100 where the top surface of the second conductive layer patterns 125A is exposed. The metal layer 150 may be formed by depositing metal, such as one or more selected from the group that includes cobalt (Co), tungsten (W), nickel (Ni), titanium (Ti), platinum (Pt), and palladium (Pd), which can form a compound by a reaction with a semiconductor material, such as silicon (Si).

Referring to FIG. 1J, the substrate 100 in which the metal layer 150 is formed is annealed. The annealing process may be performed using a rapid thermal annealing (RTA) or furnace annealing method. As a result of this process, upper parts of the second conductive layer patterns 125A, coming in contact with the metal layer 150, are silicided, thus forming etch stop layers 155 including metal silicide. The etch stop layer 155 may include cobalt silicide ($CoSi_x$), tungsten silicide ($WSi_x$), nickel silicide ($NiSi_x$), titanium silicide ($TiSi_x$), platinum silicide ($PtSi_x$), or palladium silicide ($PdSi_x$).

Referring to FIG. 1K, a strip process of removing the metal layer 150 remaining without a reaction in the annealing process is performed. In order to remove the remaining metal layer, a mixed solution of sulfuric acid ($H_2SO_4$) and hydrogen peroxide ($H_2O_2$) that is, a sulfuric acid and hydro-peroxide mixture (SPM), may be used. After the strip process, an additional annealing process may be performed.

Referring to FIG. 1L, a plurality of first material layers 160 and a plurality of second material layers 165 are alternately stacked on the space from which the metal layer 150 is removed. A structure in which the plurality of first material layers 160 and the plurality of second material layers 165 are alternately stacked is hereinafter referred to as a stack structure, for convenience of description. Meanwhile, the first material layers 160 may be disposed at the top and bottom of the stack structure. The cross section of FIG. 1L illustrates that the number of second material layers 165 is nine, but this is only illustrative. The number of second material layers 165 may be less than or greater than nine.

In the present embodiment, the first material layer 160 may be an interlayer insulating layer, and the second material layer 165 may be a sacrificial layer that is removed in a subsequent process, thus providing a space where a cell gate electrode will be formed. In this case, the first material layer 160 may include an oxide-based material, and the second material layer 165 may include a material having an etch rate different from an etch rate of the first material layer 160, for example, a nitride-based material.

However, the present invention is not limited to the above examples. In another embodiment, the first material layer 160 may be an interlayer insulating layer, and the second material layer 165 may be a conductive layer for a cell gate electrode. In this case, the first material layer 160 may include an oxide-based material, and the second material layer 165 may include a conductive material, such as polysilicon. In yet another embodiment, the first material layer 160 may be a sacrificial layer that provides a space where an interlayer insulating layer will be formed, and the second material layer 165 may be a conductive layer for a cell gate electrode. In this case, the first material layer 160 may include undoped polysilicon, and the second material layer 165 may include a conductive material, such as doped polysilicon.

Referring to FIG. 1M, pairs of main channel holes H1 where the sacrificial layer patterns 120 are exposed are formed by selectively etching the stack structure and the mask layer patterns 145A. Each of the main channel holes H1 may have a circular or oval shape when viewed from a plane parallel to the substrate 100, and each of the pairs of main channel holes H1 may be placed in each of the sacrificial layer patterns 120.

The sacrificial layer patterns 120 exposed through the pairs of main channel holes H1 are removed. In order to remove the sacrificial layer patterns 120, a wet etch process using an etch selectivity with the pipe connection gate electrode and the stack structure may be performed. As a result of this process, pipe channel holes H2 each coupling a pair of the main channel holes H1 are formed in the respective spaces from which the sacrificial layer patterns 120 are removed.

Referring to FIG. 1N a memory layer 170 and a channel layer 175 are sequentially formed on the inner walls of the pairs of main channel holes H1 and the pipe channel holes H2. The memory layer 170 may be formed by depositing a charge blocking layer, a charge trap layer, and a tunnel insulating layer sequentially.

The tunnel insulating layer is for charge tunneling and may include an oxide layer, for example. The charge trap layer functions to store data by trapping charges, and the charge trap layer may include a nitride layer, for example. The charge blocking layer functions to preclude charges within the charge trap layer from moving externally. The charge blocking layer may include an oxide layer, for example. That is, the memory layer 170 may have a triple structure of Oxide-Nitride-Oxide (ONO) layers.

Furthermore, the channel layer 175 may be formed by depositing a semiconductor material, such as polysilicon, and may be divided into a main channel layer within the main channel hole H1 and a pipe channel layer within the pipe channel hole H2. In particular, the main channel layer may be used as the channel of a memory cell or a select transistor, and the pipe channel layer may be used as the channel of a pipe connection transistor. Meanwhile, in the present embodiment, the channel layer 175 is illustrated as being formed to a thickness that fully fills the main channel holes H1 and the pipe channel holes H2, but the present invention is not limited thereto. In another embodiment, the channel layer 175 may be formed to a thickness that does not fully fill the main channel holes H1 and the pipe channel holes H2.

Referring to FIG. 1O, slits T2 are formed by selectively etching the stack structure on both sides of each of the main channel holes H1. Each of the slits T2 separates the first material layers 160 and the second material layers 165 of the cell region C in a line form. Here, the pipe connection gate electrode may be prevented from damage caused by etching, because it is protected by the etch stop layers 155, and thus a sufficient process margin may be secured.

The slit T2 may be extended in a direction crossing the cross section of FIG. 1O, and a plurality of the slits T2 may be arranged in parallel. Meanwhile, as a result of this process, the first burial insulating layers 135 may be partially etched, and the separated first material layers 160 and the separated second material layers 165 are hereinafter referred to as first material layer patterns 160A and second material layer patterns 165A, respectively.

Referring to FIG. 1P, the second material layer patterns 165A of the cell region C exposed by the formation of the slits T2 are removed. In order to remove the second material layer patterns 165A, a wet etch process using an etch selectivity with the first material layer patterns 160A may be performed.

Referring to FIG. 1Q, cell gate electrodes 180 are formed in the spaces from which the second material layer patterns 165A are removed. The cell gate electrodes 180 may be formed by the following process.

First, a conductive layer (not shown) for the cell gate electrodes is formed to a thickness that fills the spaces where the second material layer patterns 165A are removed by conformably depositing a conductive material, such as metal or metal nitride, using an ALD or CVD method. Next, the conductive layer for the cell gate electrodes is etched until the sides of the first material layer patterns 160A are exposed, with the result that the conductive layer is separated for each layer and the cell gate electrode 180 is formed between the first material layer patterns 160A.

Next, second burial insulating layers 185 are formed within the slits T2. The second burial insulating layers 185 may be formed by depositing an oxide-based or nitride-based material to a thickness that fills the slits T2 and then performing a polishing process, such as CMP, until a top surface of the first material layer patterns 160A is exposed.

Referring to FIG. 1R, a second interlayer insulating layer 190 is formed on the results in which the second burial insulating layers 185 is formed. The second interlayer insulating layer 190 may be formed by depositing an oxide-based or nitride-based material.

First contact plugs 195, which are coupled with the respective channel layers 175 in the cell region C, configured to penetrate the second interlayer insulating layer 190, are formed. Second contact plugs 200, which are coupled with the junction (not shown) of the substrate 100 in the peripheral region P, configured to penetrate the second interlayer insulating layer 190, the stack structure, the first burial insulating layer 135, and the isolation insulating layer 105, are formed. The first and the second contact plugs 195 and 200 may include a conductive material, such as doped polysilicon, metal, or metal nitride.

In accordance with the above-described fabrication method, the nonvolatile memory device in accordance with the first embodiment of the present invention, such as that shown in FIG. 1R, may be fabricated.

Referring to FIG. 1R, the nonvolatile memory device in accordance with the first embodiment of the present invention may include the isolation insulating layers 105 on the substrate 100 including the cell region C and the peripheral region P, the pipe connection gate electrode over the isolation insulating layers 105 in the cell region C, the channel layers 175 each configured to include one or more pipe channel layers formed within the pipe connection gate electrode and pairs of the main channel layers coupled with the pipe channel layers and extended in a direction substantially perpendicular to the substrate 100, the mask layer patterns 145A each interposed between the main channel layers and the pipe connection gate electrode, the plurality of first material layer patterns 160A and the plurality of cell gate electrodes 180 alternately stacked along the main channel layers, the memory layers 170 each interposed between the cell gate electrodes 180, the pipe connection gate electrode, and the channel layer 175, the peripheral gate electrodes over the isolation insulating layers 105 in the peripheral region P, the etch stop layers 155 disposed on the pipe connection gate electrode and the peripheral gate electrodes and including metal silicide, the first contact plugs 195 each coupled with the top of the channel layer 175, and the second contact plugs 200 coupled with the substrate 100 on both sides of the peripheral gate electrodes.

Here, the pipe connection gate electrode may include the first conductive layer pattern 110A for gate electrodes and the second conductive layer patterns 125A for gate electrodes in the cell region C which are separated on a block basis. The peripheral gate electrode may include the first conductive layer pattern 110A and the second conductive layer pattern 125A in the peripheral region P.

Meanwhile, the channel layer 175 may have a U shape, and the memory layer 170 may surround the channel layer 175. Furthermore, the cell gate electrodes 180 may surround the side of the main channel layer and extend in a direction crossing the cross section of FIG. 1R. In particular, the electric resistances of the pipe connection gate electrode and the peripheral gate electrodes may be significantly reduced by the etch stop layers 155 made of metal silicide having low resistivity.

Figure 2A:
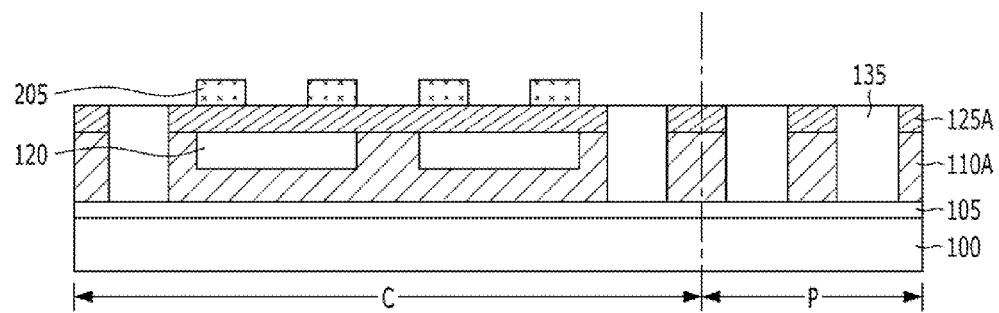
FIGS. 2A to 2D are cross-sectional views illustrating a nonvolatile memory device and a method of fabricating the same in accordance with a second embodiment of the present invention.

FIGS. 2A to 2D are cross-sectional views illustrating a nonvolatile memory device and a method of fabricating the same in accordance with a second embodiment of the present invention. In describing the present embodiment, a description of parts that are substantially identical with those of the first embodiment is omitted. Like in the first embodiment, the processes of FIGS. 1A to 1E are first performed, and a process of FIG. 2A is then performed.

Referring to FIG. 2A, third hard mask patterns 205 covering regions where the main channel holes described above will be formed are formed on the second conductive layer patterns 125A for gate electrodes in the cell region C. The third hard mask patterns 205 may prevent etch stop layers to be described later from being formed in the regions where the main channel holes will be formed in a subsequent process. The third hard mask patterns 205 may include a material, such as an oxide-based or nitride-based material, which does not form a compound by a reaction with metal.

Figure 2B:
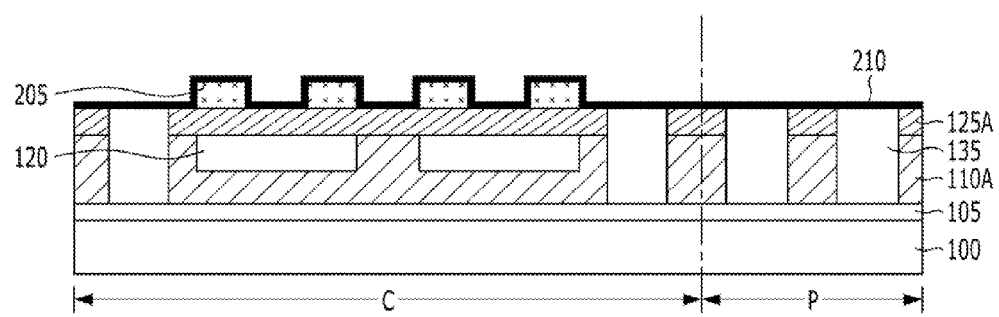

Referring to FIG. 2B a metal layer 210 is formed on the entire surface of the substrate 100 in which the third hard mask patterns 205 are formed. The metal layer 210 may be formed by conformably depositing metal, for example, one or more selected from the group that has cobalt (Co), tungsten (W), nickel (N9i), titanium (Ti), platinum (Pt), and palladium (Pd), which may form a compound by a reaction with a semiconductor material, such as silicon (Si).

Figure 2C:
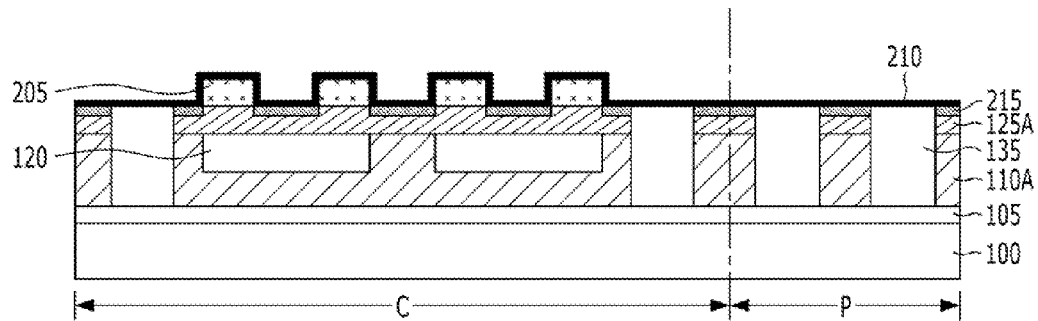

Referring to FIG. 2C, the substrate 100 in which the metal layer 210 is formed is annealed. Here, the annealing process may be performed using an RTA or furnace annealing method. As a result of this process, upper parts of the second conductive layer patterns 125A for gate electrodes, that are in contact with the metal layer 210, are silicided, thereby forming etch stop layers 215 including metal silicide.

Figure 2D:
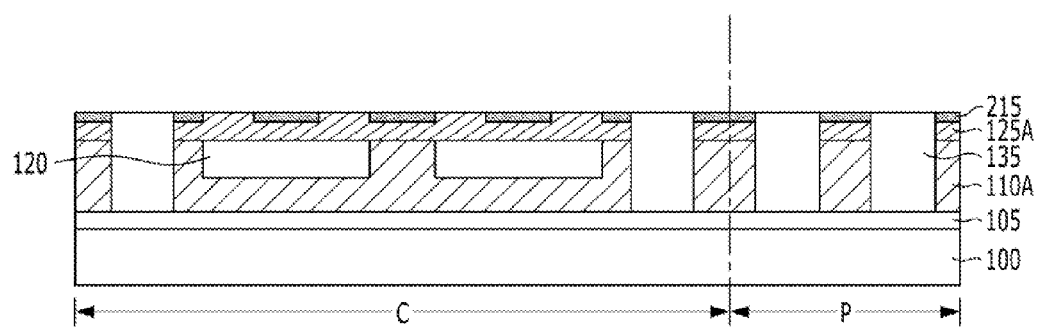

Referring to FIG. 2D, the metal layer 210, which is remaining without a reaction in the annealing process, and the third hard mask patterns 205 are removed. In order to remove the metal layer 210 and the third hard mask patterns 205, a strip process and a cleaning process may be performed. Next, like in the first embodiment, the processes of FIGS. 1L to 1R may be performed.

In accordance with the nonvolatile memory devices and the methods for fabricating the same in accordance with the embodiments of the present invention, damage caused by etching to the pipe connection gate electrode may be prevented and electric resistance may be greatly reduced by forming the etch stop layers made of metal silicide over the pipe connection gate electrode.

While the present invention has been described with respect to the specific embodiments, it will be apparent to those skilled in the art that various changes and modifications may be made without departing from the spirit and scope of the invention as defined in the following claims.

What is claimed is:

1. A method of fabricating a nonvolatile memory device, comprising:
   forming a conductive layer for a gate electrode comprising at least one or more sacrificial layer patterns over a substrate;
   forming a pipe connection gate electrode by selectively etching the conductive layer; and
   forming etch stop layers including metal silicide over the pipe connection gate electrode other than some regions over the sacrificial layer patterns,
   wherein forming the etch stop layers comprises:
   forming a hard mask pattern covering parts of the pipe connection gate electrode; and
   siliciding the exposed pipe connection gate electrode.

2. The method of claim 1, wherein forming the conductive layer for a gate electrode comprises:
   forming a first conductive layer for a gate electrode over the substrate;
   forming grooves by selectively etching the first conductive layer for a gate electrode; and
   forming sacrificial layer patterns within the grooves.

3. The method of claim 2, further comprising forming a second conductive layer for a gate electrode over the first conductive layer and the sacrificial layer patterns, after forming the sacrificial layer patterns.

4. The method of claim 1, wherein the pipe connection gate electrode is formed by separating the conductive layer on a block basis.

5. The method of claim 1, wherein forming the etch stop layers comprising:
   exposing the sacrificial layer patterns partially by selectively etching the pipe connection gate electrode;
   forming a mask layer over the exposed sacrificial layer patterns; and
   siliciding an upper part of the pipe connection gate electrode.

6. The method of claim 5, wherein siliciding the upper part of the pipe connection gate electrode comprises:
   forming a metal layer over the pipe connection gate electrode; and
   annealing the substrate in which the metal layer is formed.

7. The method of claim 1, wherein siliciding the exposed pipe connection gate electrode comprises:
   forming a metal layer over the pipe connection gate electrode; and
   annealing the substrate in which the metal layer is formed.

8. The method of claim 1, wherein the sacrificial layer patterns comprise a material having an etch rate different from an etch rate of the conductive layer.

9. The method of claim 1, wherein:

the substrate comprises a cell region and a peripheral region, and forming the pipe connection gate electrode comprises forming peripheral gate electrodes by selectively etching the conductive layer in the peripheral region.

10. The method of claim 1, further comprising:

alternately stacking a plurality of first material layers and a plurality of second material layers over the substrate in which the pipe connection gate electrode is formed, after forming the etch stop layers;

forming pairs of main channel holes where the sacrificial layer patterns are exposed by selectively etching the first material layers and the second material layers;

forming pipe channel holes for coupling the pairs of main channel holes by removing the sacrificial layer patterns; and forming channel layers within the pairs of main channel holes and the pipe channel holes.

11. The method of claim 10, wherein:

the first material layers are interlayer insulating layers, and the second material layers are sacrificial layers.

12. The method of claim 10, further comprising forming a memory layer on inner walls of the pairs of main channel holes and the pipe channel holes, after forming the pipe channel holes.

13. The method of claim 10, further comprising:

forming slits in a depth that penetrates the plurality of second material layers on both sides of the main channel hole, after forming the channel layers;

removing the second material layers exposed by the slits; and forming cell gate electrodes in spaces where the second material layers are removed.

* * * * *